(12) United States Patent
Kase et al.

(10) Patent No.: US 7,002,371 B2
(45) Date of Patent: Feb. 21, 2006

(54) LEVEL SHIFTER

(75) Inventors: Kiyoshi Kase, Austin, TX (US); May Len, Cedar Park, TX (US); Dzung T. Tran, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 31 days.

(21) Appl. No.: 10/747,748

(22) Filed: Dec. 29, 2003

(65) Prior Publication Data

US 2005/0146355 A1    Jul. 7, 2005

(51) Int. Cl.
*H03K 19/094* (2006.01)

(52) U.S. Cl. ............... 326/68; 326/81; 326/119; 326/121; 326/63; 327/333; 327/427

(58) Field of Classification Search .......... 326/62, 326/63, 68, 81, 83, 112, 119, 121; 327/333, 327/427, 327
See application file for complete search history.

(56) References Cited

U.S. PATENT DOCUMENTS

| 6,342,802 B1 * | 1/2002 | Forehand ............... 327/198 |
|---|---|---|
| 6,512,401 B1 | 1/2003 | Clark et al. |
| 6,556,061 B1 | 4/2003 | Chen et al. |
| 6,600,679 B1 | 7/2003 | Tanzawa et al. |
| 6,614,283 B1 * | 9/2003 | Wright et al. ............ 327/333 |
| 6,822,479 B1 * | 11/2004 | Rosen ..................... 326/68 |
| 2003/0112041 A1 | 6/2003 | Clark et al. |

FOREIGN PATENT DOCUMENTS

| EP | 0 608 489 B1 | 10/1993 |
|---|---|---|
| EP | 1 191 694 A1 | 8/2001 |

OTHER PUBLICATIONS

U.S. Appl. No. 10/660,847, filed Sep. 12, 2003 entitled "Level Shifter" and assigned to assignee hereof.

* cited by examiner

*Primary Examiner*—Vibol Tan
(74) *Attorney, Agent, or Firm*—David G. Dolezal

(57) ABSTRACT

A level shifter with cross coupled inverters having different threshold voltages. The output of the level shifter is pulled to a known voltage state during power up. In some examples, one of the inverters includes an additional N-channel transistor wherein the threshold voltage is greater the threshold voltage of the other inverter due to the additional transistor.

41 Claims, 5 Drawing Sheets

LEVEL SHIFTER

BACKGROUND OF THE INVENTION

1. Field of the Invention

This invention relates in general to integrated circuits and in particular to level shifters for integrated circuits

2. Description of the Related Art

Level shifters are utilized in integrated circuits for changing the voltage of a signal from a first voltage to a second voltage.

FIG. 1 is a circuit diagram of a prior art level shifter. A signal applied to input 112 may range from 0 volts to the voltage of a first supply voltage (VDD1). The shifted signal provided at output 114 in response ranges from 0V to the voltage of a second voltage supply (VDD2). Level shifter 101 includes a pair of cross coupled inverters with P-channel transistor 105 and N-channel transistor 107 making up inverter 104 and P-channel transistor 109 and N-channel transistor 111 making up inverter 106. Level shifter 101 also includes an N-channel transistor 113 having a gate connected to input 112 and a second N-channel transistor 115 having a gate coupled to input 112 via an inverter that includes P-channel transistor 117 and N-channel transistor 118.

When input 112 is at VDD1, transistors 107, 109, and 113 are conductive and transistors 105, 111, and 115 are non conductive to pull output 114 to VDD2. When input 112 is at 0V, transistors 107, 109, and 113 are non conductive and transistors 105, 111, and 115 are conductive to pull output 114 to 0V.

During the power up of a circuit incorporating level shifter 101, the output of the voltage regulator supplying supply voltage VDD2 may reach VDD2 faster than the output of the voltage regulator supplying VDD1 reaches VDD1. Because inverters 104 and 106 have the same threshold voltage, the voltage of output 114 can not be relied upon to be in the same voltage state (a known state) (either a high voltage state or a low voltage state) during each power up.

What is needed is an improved level shifter.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted.

DETAILED DESCRIPTION

The following sets forth a detailed description of a mode for carrying out the invention. The description is intended to be illustrative of the invention and should not be taken to be limiting.

It has been discovered that providing a level shifter with cross coupled inverters having threshold voltages that differ may provide for a level shifter that is biased to be in a known state during the power up of a circuit incorporating the level shifter.

Figure 2:
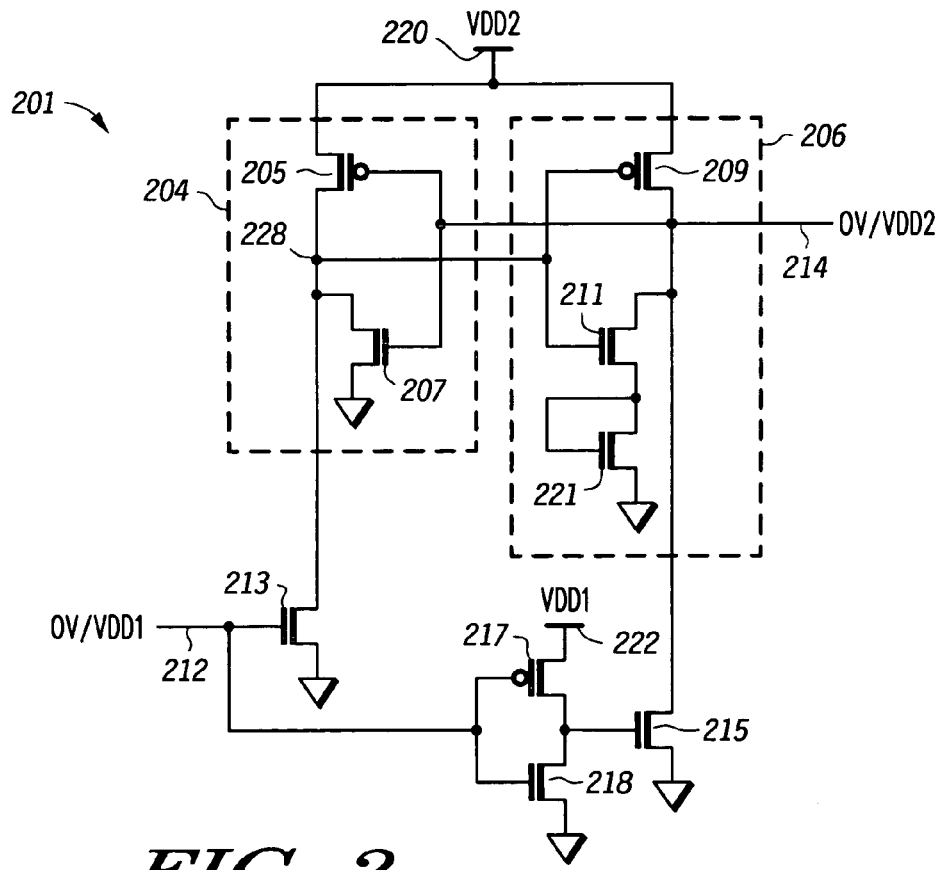
FIG. 2 is circuit diagram of one embodiment of a level shifter according to the present invention.

FIG. 2 is a circuit diagram of a level shifter according to the present invention. A signal inputted at input 212 may range from 0 volts to the voltage of a first supply voltage (VDD1). The signal provided at output 214 is shifted in a range of 0V to the voltage of a second voltage supply VDD2. Output 214 is a non inverting output in that a high voltage (e.g. VDD1) at input 212 results in a high voltage (e.g. VDD2) at output 214.

Level shifter 201 includes a pair of cross coupled inverters with inverter 204 including P-channel transistor 205 and N-channel transistor 207 and inverter 206 including P-channel transistor 209 and N-channel transistors 211 and 221. Inverter 204 has an input connected to output 214 and an output connected to node 228. Inverter 206 has an output connected to output 214 and an input connected to node 228. Level shifter 201 also includes an N-channel transistor 213 having a gate connected to input 212 and an N-channel transistor 215 having a gate coupled to input 212 via an inverter made from P-channel transistor 217 and N-channel transistor 218.

A high voltage (e.g. VDD1) at input 212 makes transistor 213 conductive, thereby pulling the voltage of the gates of transistors 209 and 211 to ground (e.g. 0 volts) to make transistor 209 conductive and transistor 211 non conductive. Making transistor 209 conductive pulls output 214 to VDD2. Because transistor 211 is non conductive, transistor 221 is also non conductive. Output 214 being pulled to VDD2 pulls the gates of transistors 205 and 207 to VDD2, thereby making transistor 205 non conductive and transistor 207 conductive. Input 212 being at VDD1 also makes transistor 217 non conductive and transistor 218 conductive to make transistor 215 non conductive.

A low voltage (e.g. 0 volts) at the input 212 makes transistor 217 conductive and transistor 218 non conductive, thereby making transistors 215 conductive. Making transistor 215 conductive pulls output 214 to ground thereby making transistor 205 conductive and transistor 207 non conductive. Making transistor 205 conductive makes transistor 209 non conductive and transistor 211 conductive. Making transistor 211 conductive makes transistor 221 conductive by pulling the gate of transistor 221 to ground.

Inverter 204 has a lower threshold voltage than inverter 206. In the embodiment shown, this difference in threshold voltage is due to the addition of transistor 221 in series with 211 in inverter 206. The gate of transistor 221 is connected to the drain (a type of current terminal for an N-channel transistor as configured) of transistor 221. In this configuration, the voltage at the gate of transistor 211 must be higher than the gate to source voltage of transistor 211 plus the gate to source voltage of transistor 221 before current flows through both transistors from output 214. However, for inverter 204, the voltage at the gate of transistor 207 only has to be higher than the gate to source voltage of transistor 207 before current flows through transistor 207. Accordingly, the threshold voltage of the inverter 206 has a higher threshold voltage than inverter 204.

In one embodiment where the lengths and widths of transistors 205, 207, 209, 211, and 221 are the same and the mobility of transistors 211 and 207 is about twice as great as the mobility of transistors 205 and 209, the threshold voltage of inverter 206 is greater than the threshold voltage of inverter 204 by about ⅔ the gate to source voltage of transistor 221. In other embodiments, the increase in threshold voltage of an inverter due to an additional N-channel transistor (e.g. 221) is given by the follow formula:

$$\Delta VTH \approx \left(1 - \frac{VTH}{VDD2}\right) Vgs;$$

where ΔVTH is the increase in threshold voltage due to the additional transistor, VTH is the threshold voltage of the inverter without the additional transistor, and Vgs is the gate to source voltage of the additional transistor. This formula assumes that the other transistors of the inverter have the same channel widths and lengths. With other embodiments, the increase in the threshold voltage due to the additional transistor may be different (e.g. ¼ of Vgs or greater) depending upon the configuration of the invertors.

During power up, a voltage source (not shown) supplying VDD2, may turn on faster than a voltage source (not shown) supplying VDD1. Accordingly, voltage rail 220 may be at VDD2 faster than voltage rail 222 reaches VDD1. This may occur for example when a voltage source (e.g. a voltage regulator) supplying VDD2 supplies the voltage to the voltage source (e.g. another voltage regulator) supplying VDD1.

If during power up, voltage rail 220 is rising from 0 volts to VDD2 and rail 222 is still at 0 volts, transistors 213 and 215 will be non conductive. During this time, output 214 and node 228 are initially at 0 volts (or at a lower voltage than the threshold voltage of inverters 204 and 206). With output 214 and node 228 initially at 0V (or at low voltage), transistors 205 and 209 are weakly conductive, thereby pulling the voltage of output 214 and node 228 higher as the voltage of rail 220 rises. Because transistor 221 increases the threshold voltage of inverter 206, current will flow through transistor 207 when output 214 is at a lower voltage than the voltage at which node 228 is at for current to flow through transistors 211 and 221. Accordingly, as the voltage of rail 220 rises, the voltage at output 214 will surpass the gate to source voltage of transistor 207 before the voltage of node 228 reaches a voltage greater than the gate to source voltage of transistor 211 plus the gate to source voltage of transistor 221. Thus, transistor 207 be conductive to pull node 228 to ground, thereby making transistor 209 fully conductive and making transistor 211 non conductive. With transistor 209 conductive, output 214 is pulled to VDD2.

Thus, during power up, output 214 of level shifter 201 will be in a known state (the high voltage state e.g. at the voltage of rail 220) prior to the rise of the voltage of rail 222.

In one embodiment, the difference in the threshold voltage between inverter 204 and 206 is 200 millivolts. However in other embodiments, the difference in threshold voltage may be greater or less (e.g. 100 mill volts). In other embodiments, the threshold voltage may be less, depending the voltage of VDD2. In other embodiments, the difference in threshold voltage may be 3% or greater of VDD2. In some embodiments, the threshold voltage difference is an amount large enough that the level shifter will be pulled to the known state during every power up.

Figure 3:
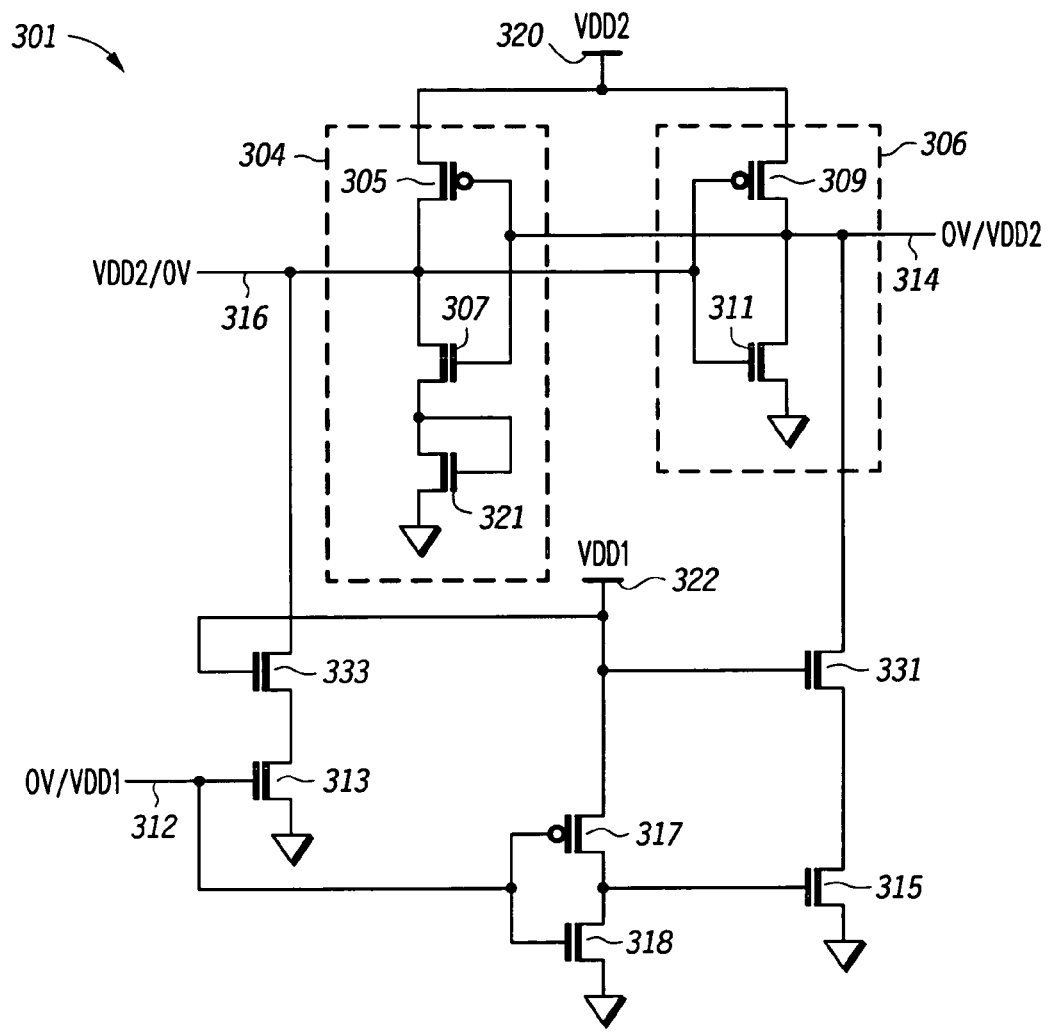
FIG. 3 is circuit diagram of another embodiment of a level shifter according to the present invention.

FIG. 3 is a circuit diagram of another embodiment of a level shifter according to the present invention. Level shifter 301 includes a non inverting output 314 and an inverting output 316. A high voltage (e.g. VDD1) at input 312 will cause a high voltage (e.g. VDD2) at output 314 and cause a low voltage (e.g. 0V) at output 316. Also, a low voltage (e.g. 0V) at input 312 will cause a high voltage (e.g. VDD2) at output 316 and cause a low voltage (e.g. 0V) at output 314.

Level shifter 301 includes a pair of cross coupled inverters with inverter 304 including P-channel transistor 305, N-channel transistor 307, and N-channel transistor 321 and inverter 306 including P-channel transistor 309 and N-channel transistor 311. Inverter 304 has an input connected to output 314 and an output connected to output 316. Inverter 306 has an output connected to output 314 and an input connected to output 316. Level shifter 301 also includes an N-channel transistor 313 having a gate connected to input 312 and an N-channel transistor 315 having a gate coupled to input 312 via a inverter made from P-channel transistor 317 and N-channel transistor 318.

Level shifter 301 includes a pair of stress reduction N-channel transistors 331 and 333 for reducing the voltage stress across transistors 313 and 315. Because in one embodiment, VDD1 is a lower voltage than VDD2, transistors 313 and 315 are designed to have a lower threshold voltage for faster switching and also have a lower maximum source to drain voltage. In some embodiments, the desired maximum source to drain voltage of transistors 313 and 315 may be less than VDD2. Using stress reduction transistors allows transistors 313 and 315 to have a low threshold voltage in that the stress reduction transistors provide a voltage drop such that the maximum source to drain voltage across transistors 313 and 315 is less than VDD2. In one embodiment, VDD2 is 3.3 V and VDD1 is 1.2 V. Thus in this embodiment, the voltage drop across transistors 333 and 331 would be approximately 2.1 volts.

In the configuration shown, the threshold voltage of inverter 304 is greater than the threshold voltage of inverter 306 due to the addition of transistor 321. One difference between the cross coupled inverter configuration of FIG. 3 versus the cross coupled inverter configuration of FIG. 2 is that the inverter (306) with a lower threshold voltage in FIG. 3 has an output connected to the non inverting output 314, whereas with FIG. 2, the inverter with the higher threshold voltage (206) has an output connected to the non inverting output 214. Accordingly, with the configuration of FIG. 3, the non inverting output 314 will be pulled to a low voltage state (0V) during the power up of a circuit, wherein with the configuration of FIG. 2, the non inverting output 214 is pulled to a high voltage state during the power up of a circuit. Also, with the configuration of FIG. 3, the inverting output 316 is pulled to a high voltage state during power up.

Figure 4:
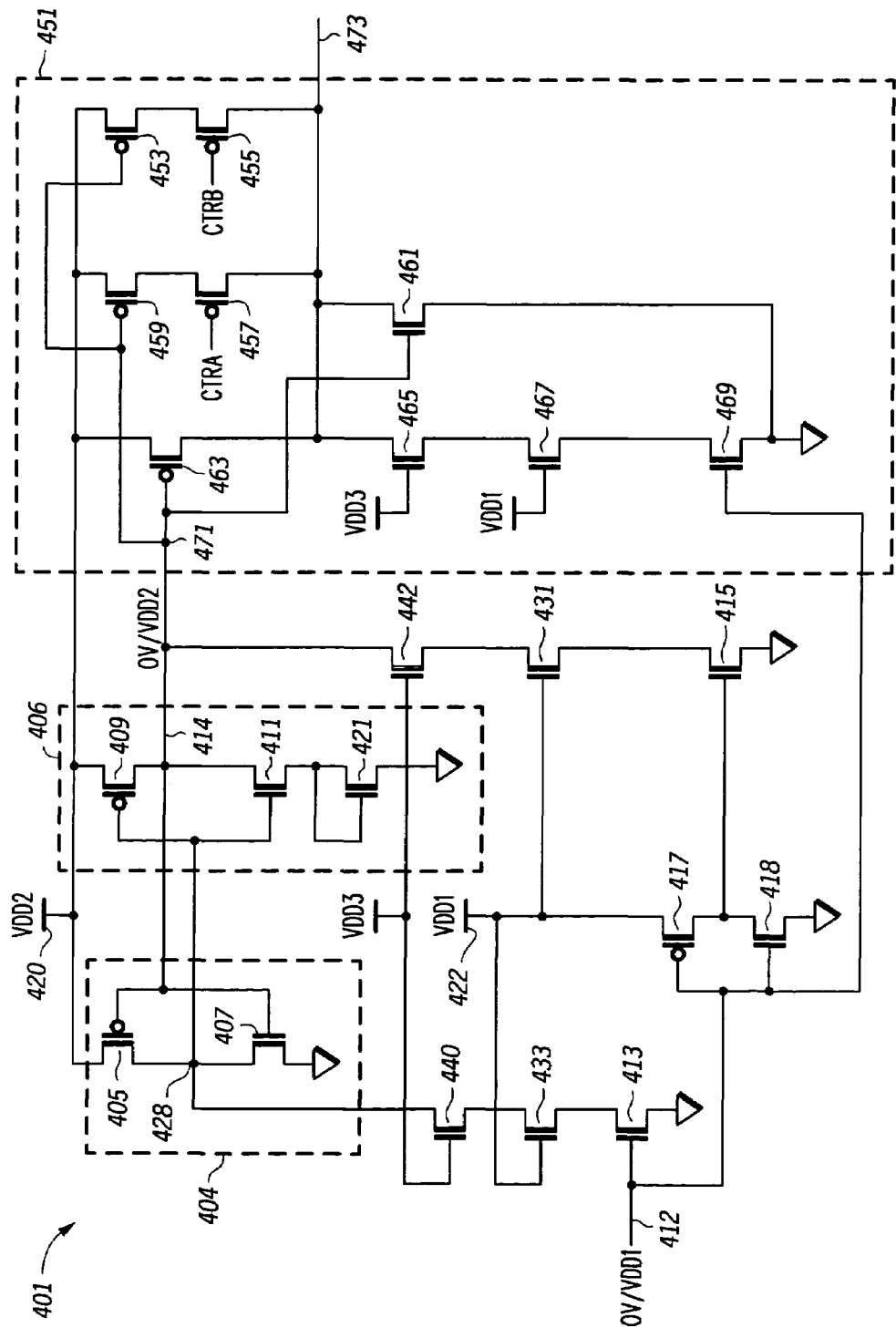
FIG. 4 is circuit diagram of another embodiment of a level shifter and a driver circuit according to the present invention.

FIG. 4 is a circuit diagram of a level shifter and a drive circuit according to the present invention. Level shifter 401 includes a pair of cross coupled inverters with inverter 404 including P-channel transistor 405 and N-channel transistor 407 and inverter 406 including P-channel transistor 409 and N-channel transistors 411 and 421. Inverter 404 has an input connected to output 414 and an output connected to node 428. Inverter 406 has an output connected to output 414 and an input connected to node 428.

The threshold voltage of inverter 406 is greater than the threshold voltage of inverter 404 due to the addition of transistor 421. Accordingly, during power up, output 414 will be pulled to a high voltage state (e.g. the voltage of rail 420).

Level shifter 401 includes two sets of stress relief transistors. The first set (transistor 433 and 431) have their gates biased at VDD1. The second set (transistors 440 and 442) have their transistors biased at an intermediate voltage (VDD3). Utilizing a second set of stress relief transistors (transistors 440 and 442) enables level shifter 401 to shift between a wider range of power supply voltages. For example, the voltage difference between VDD1 and VDD2 may be spread across the source to drain voltage drop of a transistor of the first set (e.g. 433) and a transistor of the second set (e.g. 440) Also, it enables the use of faster switching transistors for the first set of switching transistors (e.g. 433 and 431). Level shifters of other embodiments may include more than two sets of stress relief transistors.

In one example, VDD1 is 1.2V, VDD2 is 3.3 V, and VDD3 is 1.875 volts where the voltage drop across the first set of stress relief transistors (e.g. 433) is 0.5V and the voltage drop across the second set of relief transistors (e.g. 440) is about 1.8 V.

Also shown in FIG. 4 is a driver circuit 451 having an input 471 connected to output 414 and an output 473. Output 473 provides an inverted voltage state of output 414. Driver circuit 451 is utilized to speed up the effect of the relatively slow low to high voltage transition of output 414 due to the relatively weak P-channel transistors 405 and 409. Driver circuit includes transistor 469 to decrease the transition time of output 473 from a high voltage to a low voltage (which corresponds to a transition of output 414 from a low voltage to a high voltage). Driver circuit 451 includes two stress relief transistors 467 and 465.

Driver circuit 451 includes two separately controllable drive stages. The first drive stage includes transistors 459 and 457 and the second drive stage includes transistors 453 and 455. When enabled by a drive signal (CTR A and CTR B), these stage increase the drive strength of a signal on output 473 going from a low voltage to a high voltage. Driver circuits of other embodiments, may include only one drive stage or more than two drive stages. Other drive circuits would not include such drive stages. Also, other drive circuits may include a lesser number (e.g. 0 or 1) or a greater number of stress relief transistors.

The circuit shown in FIG. 4 may be modified to include a capacitor between rail 420 and output 414 for increasing the speed that output 414 goes to VDD2 during power up. With some embodiments, the capacitance of P-channel transistor 463 may provide enough capacitance to obtain the same effect.

Figure 5:
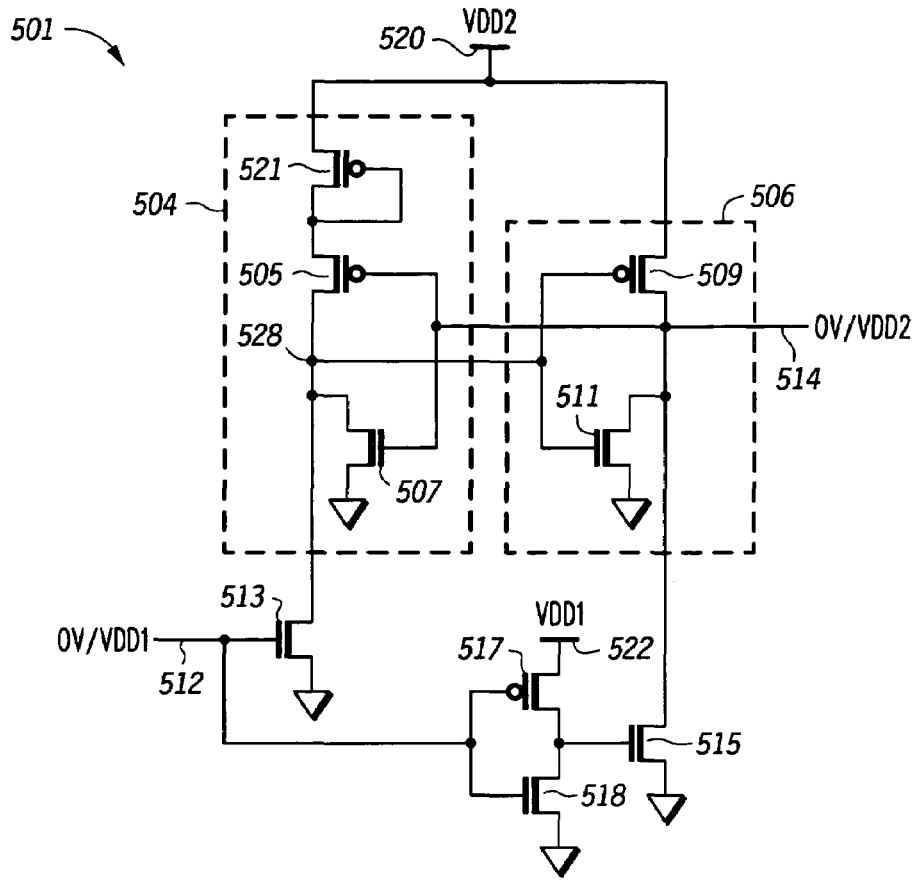
FIG. 5 is circuit diagram of another embodiment of a level shifter according to the present invention.

FIG. 5 is a circuit diagram of another embodiment of a level shifter according the present invention. Level shifter 501 includes a pair of cross coupled inverters with inverter 504 including P-channel transistors 505 and 521 and N-channel transistor 507 and inverter 506 including P-channel transistor 509 and N-channel transistor 511. Inverter 504 has an input connected to output 514 and an output connected to node 528. Inverter 506 has an output connected to output 514 and an input connected to node 528.

Inverter 504 has a lower threshold voltage than inverter 506 due to the addition of P-channel transistor 521. In one embodiment where the lengths and widths of transistors 505, 507, 509, 511, and 521 are the same and the mobility of transistors 511 and 507 is about twice as great as the mobility of transistors 505 and 509, the threshold voltage of inverter 506 is greater than the threshold voltage of inverter 504 by about ⅓ the gate to source voltage of transistor 521. In other embodiments, the decrease in threshold voltage of an inverter due to an additional P-channel transistor (e.g. 521) is given by the following formula:

$$\Delta VTH \approx \left(\frac{VTH}{VDD2}\right)Vgs;$$

where $\Delta VTH$ is the decrease in threshold voltage due to the additional transistor, VTH is the threshold voltage of the inverter without the additional transistor, and Vgs is the gate to source voltage of the additional transistor. This formula assumes that the other transistors of the inverter have the same channel widths and lengths. With other embodiments, the decrease in the threshold voltage due to the additional P-channel transistor may be different (e.g. ¼ of Vgs or greater) depending upon the configuration of the invertors.

Because the threshold voltage of inverter 504 is lower than inverter 506, non inverting output 514 will be pulled to a high voltage state during a power up. During power up and before the voltage of rail 522 begins to rise, output 514 and node 528 are initially at 0 volts (or at a lower voltage than the threshold voltage of inverters 504 and 506) due to rail 520 being at 0V or at a low voltage. With output 514 and node 528 initially at zero (or at a low voltage), transistor 509 is weakly conductive thereby pulling the voltage of output 514 higher as the voltage of rail 520 rises. Because of transistor 521, the voltage at node 528 will not begin to rise until the voltage at rail 520 has exceeded the gate to source voltage of transistor 521 plus the gate to source voltage of transistor 505. Because output 514 will reach the gate to source voltage of N-channel transistor 507 faster than the voltage of node 528 will reach the gate to source voltage of N-channel transistor 511, node 528 will be pulled to ground, fully making conductive transistor 509 to pull output 514 to VDD2.

Figure 6:
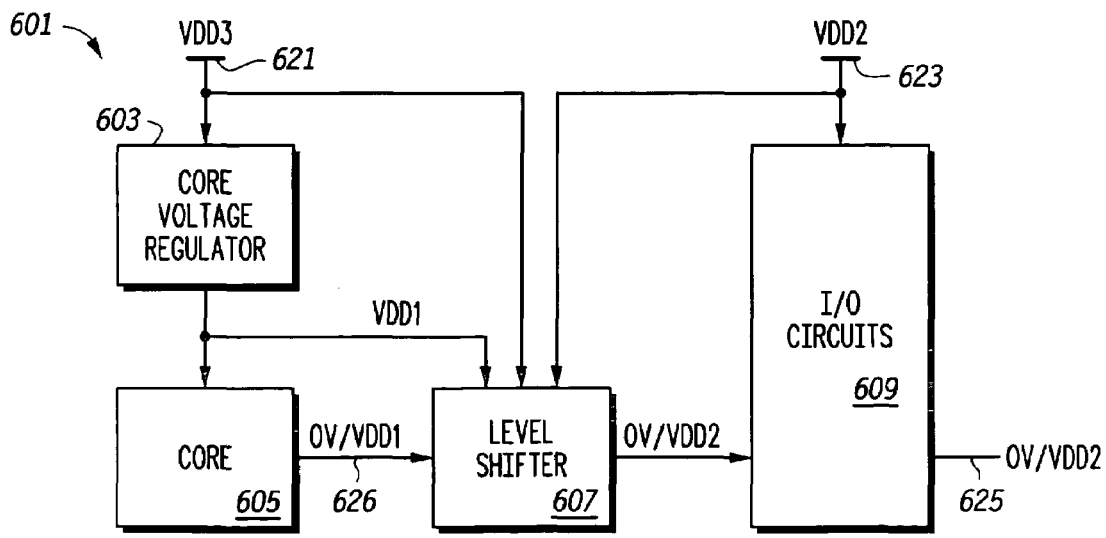
FIG. 6 is a block diagram of an integrated circuit according to present invention.

FIG. 6 is a block diagram of one embodiment of an integrate circuit according to the present invention. In the embodiment shown, circuit 601 includes a processor core 605 and I/O circuits 609 for providing an external interface for the signals of core 605. Core 605 is powered by a power supply regulator 603 at voltage VDD1, wherein the voltage of the signals of core 605 range from 0V to VDD1. In some embodiments, the voltage supplied by regulator 603 may vary for core speed optimization and power management considerations. The input and output signals of I/O circuits 609 range from 0V to VDD2, in that I/O circuits 609 are supplied with a power supply at VDD2 from rail 623. A level shifter 607 is utilized for shifting the voltage level of the high voltage state of a signal provided at processor output 626 from VDD1 to VDD2.

In the embodiment shown, regulator 603 receives power from rail 621 at a voltage of VDD3 and provides power at a voltage of VDD1 to core 605. Accordingly, during the power up of the integrated circuit, the voltage at rails 621 and 623 rise faster than the voltage supplied by regulator 603. Accordingly, level shifter 607 includes a pair of cross coupled inverters having different threshold voltages (e.g. as shown or described with respect to FIGS. 2–5) to ensure that that output 625 of I/O circuit 609 is at a known voltage state during power up of circuit 601 prior to the output of regulator 603 reaching an operating voltage.

In other embodiments, level shifters shown or described herein may be used in other types of integrated circuits.

One advantage that may occur from providing a circuit having a level shifter having an output at a known voltage state during power up is that the circuit will not provide false or errant signals to external devices during power up. Furthermore, a circuit can be designed such that the known voltage state during power up is a voltage state that will consume minimal power. Further, with such a circuit, other types of circuits for ensuring that an output I/O is at a known state may be eliminated or reduced.

Figure 1:
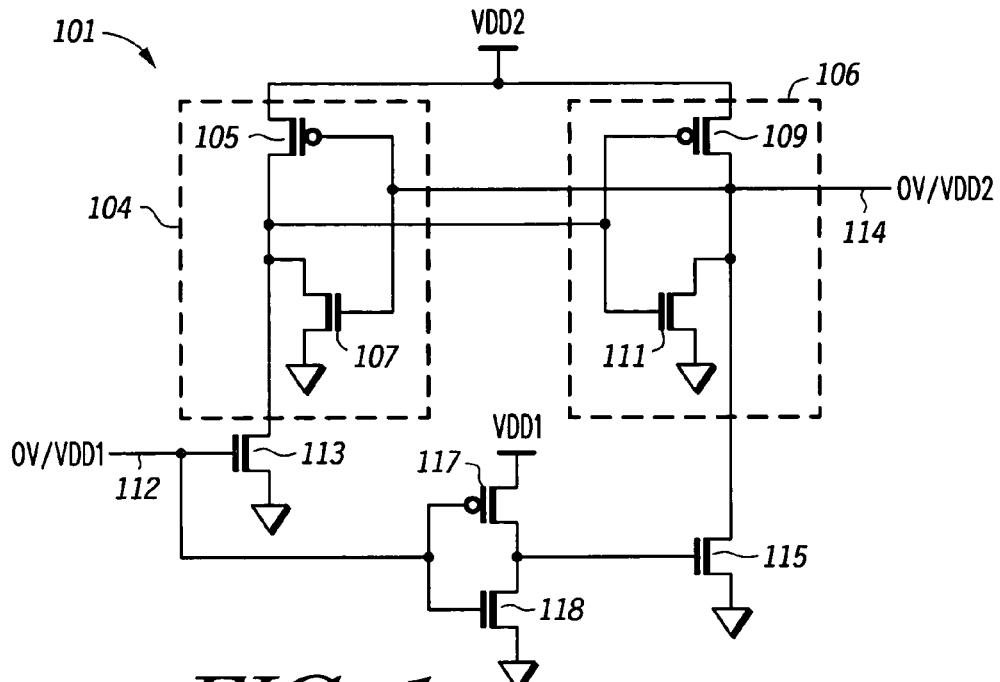
FIG. 1 is a circuit diagram of a prior art level shifter.

In other embodiments, the threshold voltage of cross coupled inverters may be varied by using transistors of different strengths to implement inverters with different threshold voltages. For example, the ratio of the strength of the N-channel transistor to the P-channel transistor may be higher in one inverter to provide for an inverter with a smaller threshold voltage. The strength of a transistor can be increased by increasing its channel width or reducing its channel length. Accordingly, inverters having the same transistor configuration may be provided with different threshold voltages by varying the channel length or channel width of one (or more) of the transistors of one inverter from the channel length or channel width of the corresponding transistor (or transistors) of the other inverter. For example, referring to FIG. 1, N-channel transistor 111 may be provided with a longer channel than N-channel transistor 107 to increase the threshold voltage of inverter 106 with respect to inverter 104 according to one embodiment of the present invention.

Figure 7:
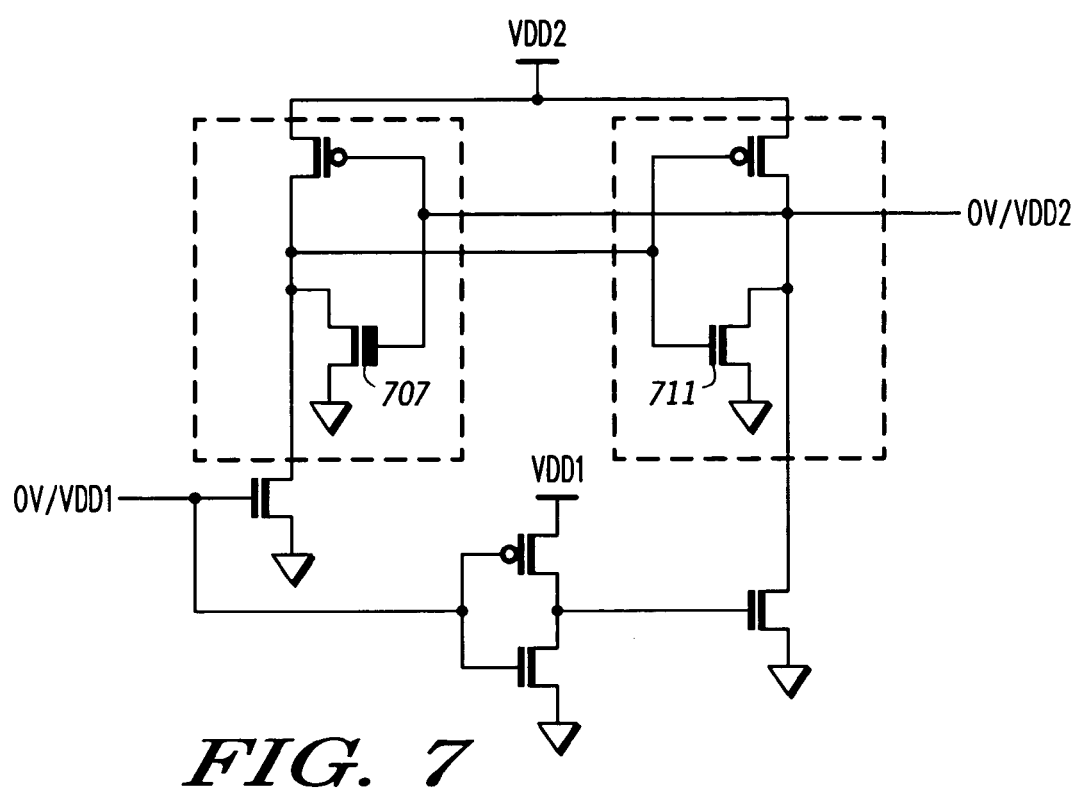
FIG. 7 is circuit diagram of another embodiment of a level shifter according to the present invention.

In other embodiments, the threshold voltage of cross coupled inverters may be varied by using transistors of different threshold voltages to implement the cross coupled inverters. FIG. 7 is a circuit diagram of another embodiment of a level shifter according to the present invention. For example, referring to FIG. 7, transistor 711 may have a lower threshold voltage than transistor 707 according to one embodiment of the present invention. For example, transistor 711 has a thinner gate dielectric than transistor 707 to provide for a lower threshold voltage.

One advantage of using an extra transistor in one inverter of the cross coupled inverters is that the cross coupled inverters can be made with N-channel transistors (or P-channel transistor is some embodiments) of the same type and dimension, thereby easing the implementation of the level shifter.

In other embodiments, inverters of other configurations may be utilized. In other embodiments, cross coupled inverters of other configurations may be utilized. In other embodiments, driver circuits of other configurations may be utilized.

In other embodiments, the threshold voltage of an inverter may be increased by adding more than one additional transistor. For example, FIG. 2 may be modified to include a second additional transistor located between transistor 221 and ground.

The features shown and described herein with respect to any embodiment, may be combined with the circuits shown or described herein of the other embodiments. For example, level shifter 501 may be modified to include stress reduction transistors as shown in FIGS. 3 and 4. Also, inverters 204, 306, and/or 404 may be modified to have the configuration of inverter 504. Furthermore, level shifters 201, 401, 501 may be modified such that their non inverting output is pulled to a known low voltage state during power up. Also, level shifter 301 may be modified for output 316 to be pulled to a high voltage state during power up.

In one embodiment of the invention, a level shifter comprises a first inverter having a first threshold voltage and a second inverter having a second threshold voltage. The second threshold voltage is greater than the first threshold voltage by at least a predetermined amount. The first inverter and the second inverter are cross-coupled.

In another embodiment of the invention, a method of making a level shifter comprises providing a first inverter having a first threshold voltage and providing a second inverter having a second threshold voltage greater than the first threshold voltage by at least a predetermined amount. The first inverter and the second inverter are cross-coupled.

In another embodiment of the invention, a level shifter comprises a first inverter having a first configuration of transistors and a second inverter having a second configuration of transistors. The first inverter and the second inverter are cross coupled. The second configuration includes an additional transistor not found in the first configuration.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A level shifter comprising:
   a first inverter having a first threshold voltage; and
   a second inverter having a second threshold voltage, the second threshold voltage being greater than the first threshold voltage by at least a predetermined amount, wherein the first inverter and the second inverter are cross-coupled;
   the first inverter has a first configuration of transistors and the second inverter has a second configuration of transistors;
   the second configuration includes an additional transistor not found in the first configuration;
   wherein the predetermined amount is at least one fourth or greater of a gate-to-source voltage of the additional transistor.

2. The level shifter of claim 1 wherein the additional transistor is an N-channel transistor.

3. The level shifter of claim 1 wherein the additional transistor is an N-channel transistor, the N-channel transistor including a gate and a drain, wherein the gate is connected to the drain.

4. The level shifter of claim 1 wherein:
   the first inverter comprises a first P-channel transistor connected in series to a first N-channel transistor;
   the second inverter comprises a second P-channel transistor connected in series to a second N-channel transistor, wherein the additional transistor is a third N-channel transistor connected in series with the second N-channel transistor.

5. The level shifter of claim 1 wherein:
   the first inverter consists essentially of two transistors connected in series;
   the second inverter consists essentially of three transistors connected in series.

6. The level shifter of claim 1 wherein:
   the first inverter includes a first transistor having a first current terminal coupled to an output of a voltage source and a second current terminal coupled to an output of the first inverter;
   the second inverter includes a second transistor having a first current terminal coupled to the output of the voltage source and a second current terminal coupled to an output of the second inverter;

during power up of the voltage source, an output of the first inverter is pulled to a low voltage state when a voltage of the output of the second inverter exceeds the threshold voltage of the first inverter.

7. The level shifter of claim 6 wherein during power up of the voltage source, the output of the first inverter is pulled to ground when a voltage of the output of the second inverter exceeds the threshold voltage of the first inverter.

8. The level shifter of claim 1 comprising:
a non inverting output connected to an output of the second inverter.

9. The level shifter of claim 1 comprising:
a non inverting output connected to an output of the first inverter.

10. The level shifter of claim 1 comprising:
an inverting output connected to an output of the second inverter.

11. The level shifter of claim 1 comprising:
an inverting output connected to an output of the first inverter.

12. The level shifter of claim 1 further comprising:
an output connected to one of an output of the first inverter and an output of the second inverter;
drive circuitry connected to the output.

13. An integrated circuit including the level shifter of claim 1.

14. The integrated circuit of claim 13 further comprising:
a first circuit coupled to an input of the level shifter, the first circuit being powered from a first voltage source;
a second circuit coupled to an output of the level shifter, the second circuit being powered from a second voltage source;
wherein the second voltage source powers up before the first voltage source;
wherein an output of the level shifter is at a known voltage state prior to a powering up of the first voltage source;
wherein the output of the level shifter is connected to one of an output of the first inverter or an output of the second inverter.

15. The level shifter of claim 1 wherein:
the first inverter includes an input and an output;
the second inverter includes an input and an output;
the output of the first inverter is connected to the input of the second inverter and the output of the second inverter is connected to the input of the first inverter.

16. The level shifter of claim 1 wherein:
the first inverter has a first transistor configuration with a first ratio of strength of a first channel type transistor to strength of a second channel type transistor;
the second inverter has a second transistor configuration with a second ratio of strength of a first channel type transistor to strength of a second channel type transistor;
the first ratio is different than the second ratio by at least a predetermined amount.

17. A level shifter comprising:
a first inverter having a first threshold voltage; and
a second inverter having a second threshold voltage, the second threshold voltage being greater than the first threshold voltage by at least a predetermined amount, wherein the first inverter and the second inverter are cross-coupled;
a transistor have a gate coupled to an input of the level shifter and a current terminal;
a stress reduction transistor having a first current terminal coupled to the current terminal of the transistor and a second current terminal coupled to an output of the first inverter or an output of the second inverter.

18. The level shifter of claim 17 wherein:
the first inverter has a first configuration of transistors and the second inverter has a second configuration of transistors;
the second configuration includes an additional transistor not found in the first configuration.

19. The level shifter of claim 18 wherein the predetermined amount is at least one fourth or greater of a gate-to-source voltage of the additional transistor.

20. The level shifter of claim 17 wherein:
the first inverter includes a transistor coupled to an output of a first voltage source and the second inverter includes a transistor coupled to the first voltage source, the first voltage source providing a first supply voltage;
the gate of the stress reduction transistor is coupled to the output of a second voltage source to be biased at a voltage that is less than the first supply voltage.

21. The level shifter of claim 20 further comprising:
an input, a voltage of the input ranging between a low voltage and a high voltage, wherein the gate of the stress reduction transistor is to be biased at a voltage that is greater than the high voltage.

22. A level shifter comprising:
a first inverter having a first threshold voltage; and
a second inverter having a second threshold voltage, the second threshold voltage being greater than the first threshold voltage by at least a predetermined amount, wherein the first inverter and the second inverter are cross-coupled;
a third transistor including a current terminal coupled to an output of the first inverter or an output of the second inverter, the third transistor including a gate coupled to an input of the level shifter;
a fourth transistor including a current terminal coupled to the output of the first inverter or an output of the second inverter, the fourth transistor including a gate;
a third inverter having an input coupled to the input of the third transistor and an output coupled to the gate of the fourth transistor;
wherein the third inverter includes a transistor having a current terminal, wherein the current terminal is coupled to a first voltage source;
wherein the first inverter includes a first transistor having a current terminal coupled to a second voltage source;
wherein the second inverter includes a second transistor having a current terminal coupled to the second voltage source;
wherein the second voltage source powers up before the first voltage source.

23. A level shifter comprising:
a first inverter having a first threshold voltage; and
a second inverter having a second threshold voltage, the second threshold voltage being greater than the first threshold voltage by at least a predetermined amount, wherein the first inverter and the second inverter are cross-coupled;
the first inverter has a first configuration of transistors and the second inverter has a second configuration of transistors;
the first configuration includes an additional transistor not found in the second configuration.

24. The level shifter of claim 23 wherein the additional transistor is a P-channel transistor.

25. The level shifter of claim 23 wherein the predetermined amount is at least one fourth or greater of a gate-to-source voltage of the additional transistor.

26. The level shifter of claim 23 wherein the additional transistor is an P-channel transistor, the P-channel transistor including a gate and a drain, wherein the gate is connected to the drain.

27. A level shifter comprising:
a first inverter having a first threshold voltage; and
a second inverter having a second threshold voltage, the second threshold voltage being greater than the first threshold voltage by at least a predetermined amount, wherein the first inverter and the second inverter are cross-coupled;
the first inverter includes a first transistor of a first channel type;
the second inverter includes a second transistor of the first channel type;
wherein the first transistor has a gate dielectric of a different thickness than a gate dielectric of the second transistor.

28. A level shifter comprising:
a first inverter having a first threshold voltage; and
a second inverter having a second threshold voltage, the second threshold voltage being greater than the first threshold voltage by at least a predetermined amount, wherein the first inverter and the second inverter are cross-coupled;
the first inverter has a first transistor configuration with a first transistor;
the second inverter has a second transistor configuration with a second transistor corresponding to the first transistor of the first transistor configuration;
the first transistor has a strength different from a strength of the second transistor by at least a predetermined amount.

29. A method of making a level shifter comprising:
providing a first inverter having a first threshold voltage; and
providing a second inverter having a second threshold voltage greater than the first threshold voltage by at least a predetermined amount, wherein the first inverter and the second inverter are cross-coupled;
wherein the first inverter has first configuration of transistors
wherein the second inverter has a second configuration of transistors,
wherein the second configuration includes an additional transistor not found in the first configuration;
wherein the predetermined amount is at least one-fourth or greater of a gate-to-source voltage of the additional transistor.

30. A method of making a level shifter comprising:
providing a first inverter having a first threshold voltage; and
providing a second inverter having a second threshold voltage greater than the first threshold voltage by at least a predetermined amount, wherein the first inverter and the second inverter are cross-coupled;
wherein the first inverter has a first configuration of transistors
wherein the second inverter has a second configuration of transistors,
wherein the second configuration includes an additional transistor not found in the first configuration;
wherein the additional transistor includes a drain and a gate, the gate being connected to the drain.

31. A method of making a level shifter comprising:
providing a first inverter having a first threshold voltage; and
providing a second inverter having a second threshold voltage greater than the first threshold voltage by at least a predetermined amount, wherein the first inverter and the second inverter are cross-coupled;
the first inverter has a first configuration of transistors;
the second inverter has a second configuration of transistors;
wherein the first configuration includes an additional transistor not found in the second configuration.

32. The method of claim 31 wherein the additional transistor includes a drain and a gate, the gate being connected to the drain.

33. A level shifter comprising:
a first inverter having a first configuration of transistors;
a second inverter having a second configuration of transistors;
wherein the first inverter and the second inverter are cross coupled;
wherein the second configuration includes an additional transistor not found in the first configuration;
wherein the additional transistor includes a drain and a gate, wherein the gate is connected to the drain.

34. The level shifter of claim 33 wherein:
the first inverter has a threshold voltage and the second inverter has a threshold voltage;
the threshold voltage of the first inverter is greater than the threshold voltage of the second inverter by at least a predetermined amount.

35. The level shifter of claim 33 wherein:
the first inverter has a threshold voltage and the second inverter has a threshold voltage;
the threshold voltage of the first inverter is less than the threshold voltage of the second inverter by at least a predetermined amount.

36. The level shifter of claim 33 wherein the additional transistor is an N-channel transistor.

37. The level shifter of claim 33 wherein the additional transistor is a P-channel transistor.

38. The level shifter of claim 34 wherein:
the first configuration includes a first transistor of a first channel type connected in series with a second transistor of a second channel type;
the second configuration includes a third transistor of the first channel type connected in series with a fourth transistor of the second channel type;
the additional transistor is a transistor of the second channel type and is connected in series with the fourth transistor.

39. The level shifter of claim 33 further comprising:
an output, the output connected to an output of the first inverter.

40. The level shifter of claim 33 further comprising:
an output, the output connected to an output of the second inverter.

41. The level shifter of claim 33 further comprising:
an output, the output connected to an output of one of an output of the first inverter or an output of the second inverter;
driver circuitry connected to the output.

* * * * *

UNITED STATES PATENT AND TRADEMARK OFFICE
CERTIFICATE OF CORRECTION

| | | |
|---|---|---|
| PATENT NO. | : 7,002,371 B2 | Page 1 of 1 |
| APPLICATION NO. | : 10/747748 | |
| DATED | : December 29, 2003 | |
| INVENTOR(S) | : Kiyoshi Kase et al. | |

It is certified that error appears in the above-identified patent and that said Letters Patent is hereby corrected as shown below:

Column 12, Line 42, Claim No. 38:
    Change "34" to --33--

Signed and Sealed this

Twentieth Day of May, 2008

JON W. DUDAS
*Director of the United States Patent and Trademark Office*

UNITED STATES PATENT AND TRADEMARK OFFICE
CERTIFICATE OF CORRECTION

PATENT NO. : 7,002,371 B2  
APPLICATION NO. : 10/747748  
DATED : February 21, 2006  
INVENTOR(S) : Kiyoshi Kase et al.

Page 1 of 1

It is certified that error appears in the above-identified patent and that said Letters Patent is hereby corrected as shown below:

Column 12, Line 42, Claim No. 38:
    Change "34" to --33--

This certificate supersedes the Certificate of Correction issued May 20, 2008.

Signed and Sealed this

Seventeenth Day of June, 2008

JON W. DUDAS  
*Director of the United States Patent and Trademark Office*